United States Patent
Takaiwa

(10) Patent No.: US 9,451,145 B2
(45) Date of Patent: Sep. 20, 2016

(54) IMAGE CAPTURING APPARATUS INCLUDING AN IMAGE SENSOR THAT HAS PIXELS FOR DETECTING A PHASE DIFFERENCE AND CONTROL METHOD FOR THE SAME

(75) Inventor: Kan Takaiwa, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 274 days.

(21) Appl. No.: 13/299,691

(22) Filed: Nov. 18, 2011

(65) Prior Publication Data

US 2012/0133821 A1 May 31, 2012

(30) Foreign Application Priority Data

Nov. 25, 2010 (JP) ................................ 2010-262903

(51) Int. Cl.
*H04N 5/232* (2006.01)
*G02B 7/34* (2006.01)

(52) U.S. Cl.
CPC ............ *H04N 5/23212* (2013.01); *G02B 7/34* (2013.01); *H04N 5/23209* (2013.01)

(58) Field of Classification Search
CPC .................. H04N 5/238; G03B 13/36; G03B 7/34–7/346
See application file for complete search history.

(56) References Cited

U.S. PATENT DOCUMENTS

| 4,591,919 A * | 5/1986 | Kaneda et al. ............... 348/348 |
| 2001/0048474 A1* | 12/2001 | Yamazaki et al. ............ 348/207 |
| 2004/0057712 A1* | 3/2004 | Sato et al. ...................... 396/89 |
| 2007/0206940 A1* | 9/2007 | Kusaka ......................... 396/128 |
| 2007/0230937 A1* | 10/2007 | Ide et al. ....................... 396/125 |
| 2008/0240701 A1* | 10/2008 | Kusaka ......................... 396/104 |
| 2008/0258039 A1* | 10/2008 | Kusaka ........................ 250/201.8 |
| 2009/0147122 A1* | 6/2009 | Kato ........................ 348/333.01 |
| 2010/0238343 A1* | 9/2010 | Kawarada ..................... 348/345 |
| 2011/0267533 A1* | 11/2011 | Hirose .......................... 348/345 |

FOREIGN PATENT DOCUMENTS

| JP | 02-140074 | 5/1990 |
| JP | 2007-065330 | 3/2007 |
| JP | 2007-248782 | 9/2007 |
| JP | 2008-058482 A | 3/2008 |
| JP | 2010-181751 A | 8/2010 |
| JP | 2010-217618 A | 9/2010 |

OTHER PUBLICATIONS

The documents cited herein were cited in the Sep. 19, 2014 Japanese Office Action, which is enclosed without an English Translation, that issued in Japanese Patent Application No. 2010-262903.

* cited by examiner

*Primary Examiner* — Dennis Hogue
(74) *Attorney, Agent, or Firm* — Cowan, Liebowitz & Latman, P.C.

(57) ABSTRACT

An image capturing apparatus that uses an image sensor having pixels for capturing an image and pixels for detecting a phase difference. If, in the case where it is determined that it is necessary to restart focus detection during recording of a moving image, an opening diameter of an aperture is not an opening diameter at which phase-difference detection type AF using the pixels for detecting a phase difference can be performed, the aperture is changed to an opening diameter at which phase-difference detection type AF can be performed during focus detection. Thus, even if a photographic lens that does not support driving within a minute range is mounted, a focus detection operation suitable for shooting a moving image can be performed.

11 Claims, 10 Drawing Sheets

FIG. 5

|  | m−4 | m−3 | m−2 | m−1 | m | m+1 | m+2 | m+3 | m+4 |
|---|---|---|---|---|---|---|---|---|---|
| k−4 | a(m−4, k−4) | a(m−3, k−4) | a(m−2, k−4) | a(m−1, k−4) | a(m, k−4) | a(m+1, k−4) | a(m+2, k−4) | a(m+3, k−4) | a(m+4, k−4) |
| k−3 | a(m−4, k−3) | a(m−3, k−3) | a(m−2, k−3) | a(m−1, k−3) | a(m, k−3) | a(m+1, k−3) | a(m+2, k−3) | a(m+3, k−3) | a(m+4, k−3) |
| k−2 | a(m−4, k−2) | a(m−3, k−2) | a(m−2, k−2) | a(m−1, k−2) | a(m, k−2) | a(m+1, k−2) | a(m+2, k−2) | a(m+3, k−2) | a(m+4, k−2) |
| k−1 | a(m−4, k−1) | a(m−3, k−1) | a(m−2, k−1) | a(m−1, k−1) | a(m, k−1) | a(m+1, k−1) | a(m+2, k−1) | a(m+3, k−1) | a(m+4, k−1) |
| k | a(m−4, k) | a(m−3, k) | a(m−2, k) | a(m−1, k) | a(m, k) | a(m+1, k) | a(m+2, k) | a(m+3, k) | a(m+4, k) |
| k+1 | a(m−4, k+1) | a(m−3, k+1) | a(m−2, k+1) | a(m−1, k+1) | a(m, k+1) | a(m+1, k+1) | a(m+2, k+1) | a(m+3, k+1) | a(m+4, k+1) |
| k+2 | a(m−4, k+2) | a(m−3, k+2) | a(m−2, k+2) | a(m−1, k+2) | a(m, k+2) | a(m+1, k+2) | a(m+2, k+2) | a(m+3, k+2) | a(m+4, k+2) |
| k+3 | a(m−4, k+3) | a(m−3, k+3) | a(m−2, k+3) | a(m−1, k+3) | a(m, k+3) | a(m+1, k+3) | a(m+2, k+3) | a(m+3, k+3) | a(m+4, k+3) |
| k+4 | a(m−4, k+4) | a(m−3, k+4) | a(m−2, k+4) | a(m−1, k+4) | a(m, k+4) | a(m+1, k+4) | a(m+2, k+4) | a(m+3, k+4) | a(m+4, k+4) |

IMAGE CAPTURING APPARATUS INCLUDING AN IMAGE SENSOR THAT HAS PIXELS FOR DETECTING A PHASE DIFFERENCE AND CONTROL METHOD FOR THE SAME

BACKGROUND OF THE INVENTION

1. Field of the Invention

The present invention relates to an image capturing apparatus and a control method for the image capturing apparatus, and particularly relates to an image capturing apparatus that is capable of recording moving images and a control method for the image capturing apparatus.

2. Description of the Related Art

Conventionally, image capturing apparatuses that have an automatic focus detection (AF) function and are capable of capturing moving images are known. For example, Japanese Patent Laid-Open No. 02-140074 discloses a video camera having an automatic focus detection (contrast-detection type AF) function that employs so-called hill-climbing control that successively drives a focus detection lens based on contrast components of an object image. In Japanese Patent Laid-Open No. 02-140074, after the focus detection lens is stopped at a focusing position, when the need to perform focus detection once more arises, the focus detection lens is first driven back and forth to detect a focusing direction, and then hill-climbing control is performed while driving the focus detection lens in the detected direction.

As an automatic focus detection method, in addition to the aforementioned contrast-detection type AF, for example, phase-difference detection type AF that determines a non-focusing distance (defocus amount) using a phase difference between images formed by light beams passing through different regions of an exit pupil of a lens also is commonly used.

Moreover, a combination of the contrast-detection type AF and the phase-difference detection type AF has also been proposed. For example, Japanese Patent Laid-Open No. 2007-248782 proposes a focus detecting apparatus that performs focus detection using the contrast-detection type AF in the case where the exit pupil is reduced in size by an aperture mechanism of a lens and therefore the phase-difference detection type AF cannot be used in a currently set focus detection region.

It has hitherto been common that the contrast-detection type AF detects focus information (contrast components) from a captured image, and the phase-difference detection type AF detects focus information (a pair of images) using a detecting device separate from an image sensor. However, an image capturing apparatus having an image sensor in which pixels for detecting a phase difference are formed and performing the contrast-detection type AF and the phase-difference detection type AF using an output from the image sensor has also been proposed (Japanese Patent Laid-Open No. 2007-65330).

Conventionally, small digital cameras in which an electronic viewfinder (EVF) is mainly used usually had a moving image shooting function, but many lens-interchangeable type digital cameras did not have the moving image shooting function or were not able to perform automatic focus detection during shooting of a moving image. However, in recent years, an increasing number of lens-interchangeable type digital cameras have been provided with a so-called live view function that is similar to the EVF, and at the same time, the moving image shooting function has also become standard.

In this manner, digital (still) cameras and digital video cameras are becoming functionally more similar to each other. However, there is still a great difference in terms of the automatic focus detection method. Video cameras are primarily intended to shoot moving images and therefore perform automatic focus detection on the assumption that the focusing distance fluctuates. Specifically, even after the focus has been detected, video cameras perform detection of a focusing direction by continuously moving (wobbling) the focus detection lens back and forth within a minute range (a range that does not significantly affect a moving image to be shot) around the focusing position. For this reason, a photographic lens that supports wobbling is used as well.

In contrast, digital still cameras are primarily intended to shoot still images, and therefore, in the case where the focus has been detected, the focus detection lens usually is stopped at that focusing position. Accordingly, many photographic lenses for use in digital still cameras do not support driving within a minute range, such as wobbling. For this reason, if driving for detection of the focusing direction like wobbling is performed once the focus has been detected, the resulting drive distance becomes long and affects the image quality of a captured image. In the case of fixed lens type digital still cameras, this problem is expected to be solved in the near future because it is envisaged that fixed lens type digital still cameras equipped with a lens that allows for wobbling will increase in the future. However, as for lens-interchangeable type digital still cameras, it is unlikely that all the available photographic lenses (interchangeable lenses) will support wobbling in the near future, and so it is envisaged that the problem will remain for some time.

SUMMARY OF THE INVENTION

The present invention has been made in view of problems of conventional technologies such as those described above, and provides an image capturing apparatus that is capable of performing a focus detection operation suitable for shooting a moving image even when equipped with a photographic lens that does not support driving within a minute range, and a control method for the image capturing apparatus.

According to one aspect of the present invention, there is provided an image capturing apparatus having an image sensor that has pixels for capturing an image and pixels for detecting a phase difference, and a decision unit that decides a focus drive distance and a drive direction for a photographic lens using a phase difference signal obtained from the pixels for detecting a phase difference, and being capable of recording a moving image captured by the image sensor, the apparatus comprising: a determination unit that, if it is required to restart focus detection during recording of a moving image and while focus driving of the photographic lens is stopped, determines whether or not an opening diameter of an aperture of the photographic lens is an opening diameter at which the decision by the decision unit using the phase difference signal obtained from the pixels for detecting a phase difference contained in a currently set focus detection region can be performed; a control unit that, if it is determined by the determination unit that the opening diameter of the aperture of the photographic lens is not the opening diameter at which the decision by the decision unit using the phase difference signal obtained from the pixels for detecting a phase difference contained in the currently set focus detection region can be performed, changes the opening diameter of the aperture of the photographic lens to a size at which the decision by the decision unit can be performed, while the decision unit is deciding the focus drive distance and the drive direction for the photographic lens; and a drive unit that performs focus driving of the photographic lens in accordance with the focus drive distance and the drive direction decided by the decision unit.

Further features of the present invention will become apparent from the following description of exemplary embodiments with reference to the attached drawings.

BRIEF DESCRIPTION OF THE DRAWINGS

FIG. 5 is a diagram showing a sequence of pixels in the vicinity of a pixel of interest a(m, k) of a video signal according to the first embodiment of the present invention.

DESCRIPTION OF THE EMBODIMENTS

Exemplary embodiments of the present invention will now be described in detail in accordance with the accompanying drawings.

First Embodiment

Figure 1:
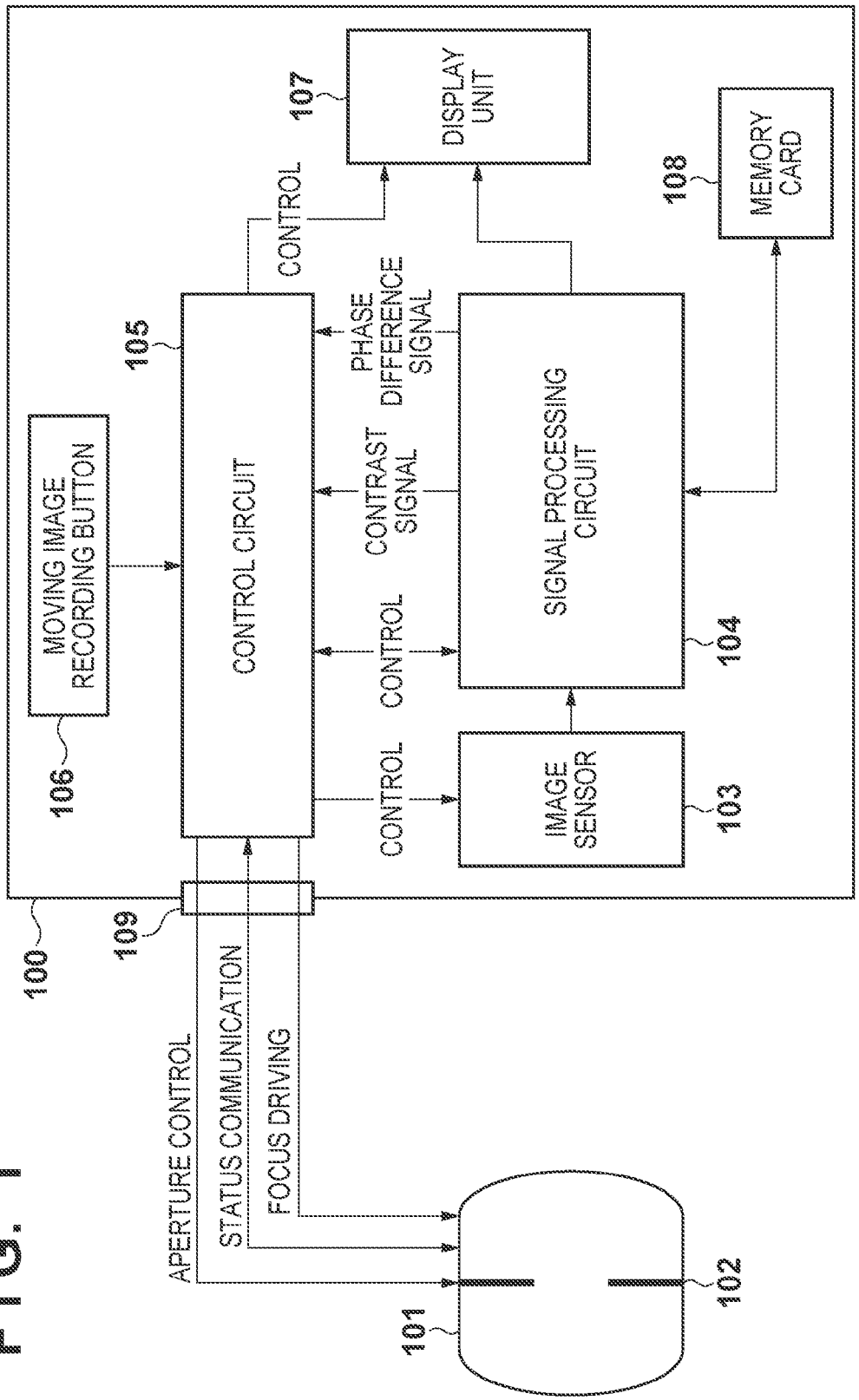
FIG. 1 is a block diagram showing an example of the configuration of an image capturing apparatus according to a first embodiment of the present invention.

FIG. 1 is a block diagram showing an example of the configuration of an image capturing apparatus according to a first embodiment of the present invention. An image capturing apparatus 100 according to the present embodiment is a lens-interchangeable type, to which a photographic lens 101 is removably attached via a lens mount 109. The image capturing apparatus 100 and the photographic lens 101 can perform interactive communication via the lens mount 109. Reference numeral 102 indicates an aperture incorporated in the photographic lens 101, reference numeral 103 indicates an image sensor, reference numeral 104 indicates a signal processing circuit, reference numeral 105 indicates a control circuit, reference numeral 106 indicates a moving image recording button, reference numeral 107 indicates a display unit, and reference numeral 108 indicates a removable memory card.

An object image is projected onto the image sensor 103 by the photographic lens 101 and converted to an electric signal, and at that time, the aperture 102 is set to an appropriate opening size by an automatic exposure control function of the image capturing apparatus 100 so that an appropriate amount of light beams for shooting an image is allowed to reach the image sensor 103.

A photoelectrically converted image signal of the object image is read out from the image sensor 103. As will be described later, the image sensor 103 is provided with pixels for detecting a phase difference in addition to ordinary pixels (pixels for capturing an image), and signals from these two types of pixels are read out and input to the signal processing circuit 104. It should be noted that in the present embodiment, partial regions of the image sensor 103 can be set as focus detection regions, and it is assumed that each of the focus detection regions that can be set contains pixels for detecting a phase difference for performing the phase-difference detection type AF.

The signal processing circuit 104 applies different types of processing to signals from pixels for capturing an image and signals from pixels for detecting a phase difference. The signal processing circuit 104 applies image processing (also called development processing) such as color interpolation processing and gamma processing as do conventional image processing circuits to signals from the pixels for capturing an image and converts the signals to a video signal. It should be noted that since a signal for an image cannot be obtained from the pixels for detecting a phase difference, the signal processing circuit 104 generates signals for an image at the pixels for detecting a phase difference from signals from neighboring pixels for capturing an image by performing predetermined interpolation processing.

Moreover, the signal processing circuit 104 applies predetermined processing to a video signal obtained from the signals from the pixels for capturing an image to obtain a contrast signal (for example, high-frequency components in a spatial frequency region).

The video signal generated in the signal processing circuit 104 is displayed on the display unit 107. The foregoing processing is performed successively (for example, 30 times/second), and thus a moving image is captured. It is possible to cause the display unit 107 to function as an electronic viewfinder (EVF) by displaying this moving image on the display unit 107. Moreover, when a recording instruction is provided by, for example, pressing the moving image recording button 106, the signal processing circuit 104 applies compression processing to the video signal to generate a video signal for recording, and starts recording on the memory card 108. Display of the video image on the display unit 107 is continued not only during a period (stand-by period) until the moving image recording button 106 is pressed, but also during recording of the moving image, in tandem with recording on the memory card 108. It should be noted that the resolution of a video image (video image for display) to be displayed on the display unit 107 may be reduced to a lower resolution than the resolution of a video image for recording in order to alleviate the processing load. When the moving image recording button 106 is pressed again during recording of the moving image, the signal processing circuit 104 stops recording of the moving image on the memory card 108, but continues displaying on the display unit 107.

On the other hand, the signal processing circuit 104 applies predetermined processing to signals from a plurality of pixels for detecting a phase difference that receive light beams passing through the same region of the exit pupil of the photographic lens 101, and generates a phase difference detection signal. Furthermore, the signal processing circuit 104 generates a phase difference signal from a phase difference detection signal obtained from a plurality of pixels for detecting a phase difference that are arranged close to each other in the image sensor 103 and that receive light beams passing through different regions of the exit pupil of the photographic lens 101.

The control circuit 105 calculates a drive distance and a drive direction for a focus adjustment lens included in the photographic lens 101 based on the phase difference signal generated by the signal processing circuit 104, generates a corresponding focus driving signal, and supplies the generated signal to the photographic lens 101. Focus detection during continuous shooting is performed during intervals between readouts of image signals for an image to be recorded using the read-out image signals.

The photographic lens 101 and the control circuit 105 of the image capturing apparatus 100 exchange an aperture control signal for controlling the aperture 102, a status signal for determining the state of the lens, and the like as well as the above-described focus driving signal. The content of the status signal includes, for example, lens type information for determining the type of the photographic lens 101 that is mounted and information on an aperture value.

FIGS. 2A to 4B are diagrams for explaining the structures of the pixels for capturing an image and the pixels for detecting a phase difference (AF pixels).

The image sensor 103 of the present embodiment employs a Bayer array in which two pixels having a spectral sensitivity to G (green) are positioned as two diagonally opposed pixels of four adjacent pixels arranged in two rows and two columns, and two pixels having spectral sensitivities to R (red) and B (blue), respectively, are positioned as the other two pixels. Moreover, as part of the pixels in the Bayer array, pixels for detecting a phase difference having a structure that will be described later are dispersedly allocated in conformity with a predetermined rule.

Figures 2A, 2B:
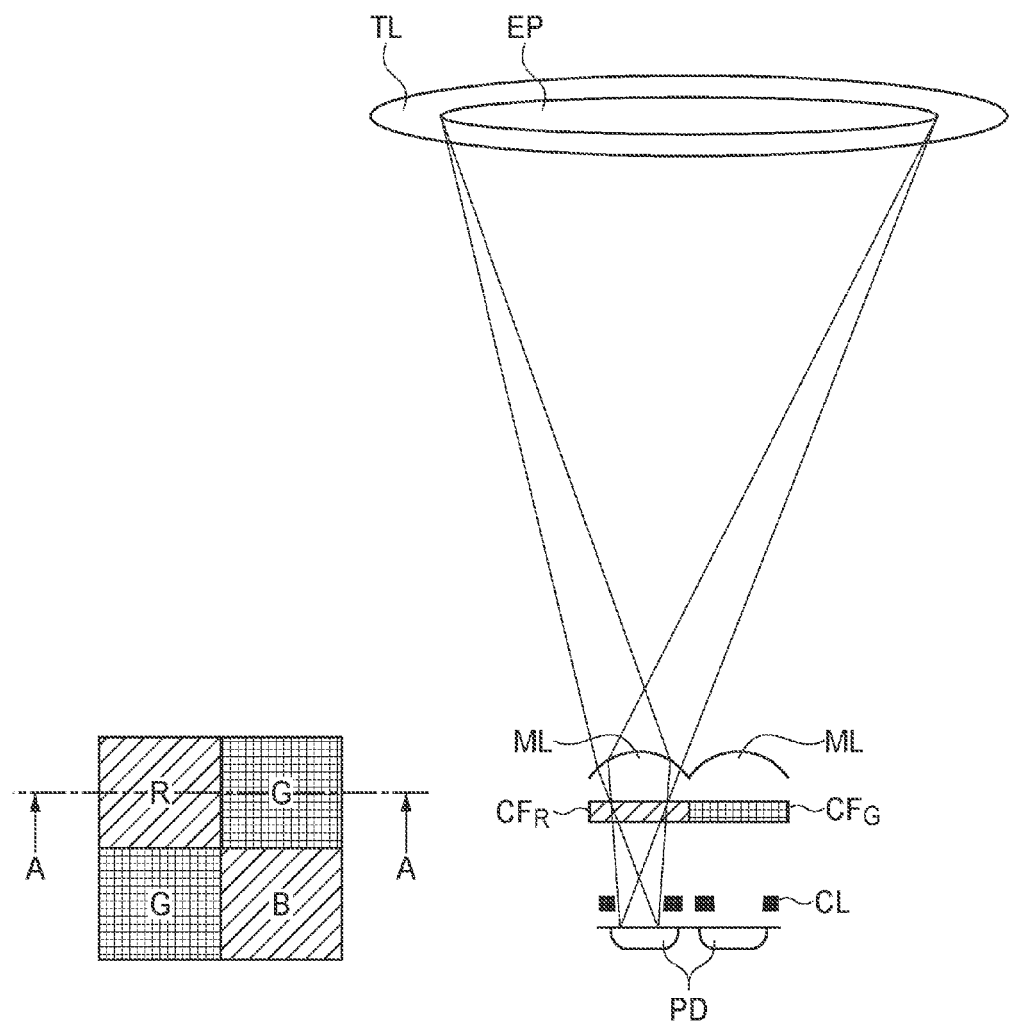
FIGS. 2A and 2B are diagrams showing an example of the arrangement and the structure of pixels for capturing an image according to the first embodiment of the present invention.

FIGS. 2A and 2B show an example of the arrangement and the structure of pixels for capturing an image according to the present embodiment.

FIG. 2A is a plan view of pixels for capturing an image arranged in two rows and two columns. As described above, in the Bayer array, two G pixels are positioned in a diagonal direction, and R and B pixels are positioned as the other two pixels. Then, such an arrangement of two rows and two columns is repeated over the entire image sensor 103.

FIG. 2B is a diagram showing a cross-section taken along line A-A in FIG. 2A and light paths from a photographic optical system.

ML indicates an on-chip micro lens that is disposed at the front of each pixel, CFR indicates an R (red) color filter, and CFG indicates a G (green) color filter. PD indicates a schematic representation of a photoelectric conversion unit of each pixel, and CL indicates a wiring layer for forming a signal line that transmits various types of signals in a CMOS image sensor. TL indicates a schematic representation of the photographic optical system.

Here, the on-chip micro lens ML and the photoelectric conversion unit PD of the pixels for capturing an image are configured so as to capture light beams passing through the photographic optical system TL as effectively as possible. In other words, the exit pupil EP of the photographic optical system TL and the photoelectric conversion unit PD are made to be conjugate to each other by the micro lens ML, and the photoelectric conversion unit PD is designed so as to have a large effective area. Moreover, although FIG. 2B shows the light beams incident on the R pixel, the G pixels and the B (blue) pixel also have the same structure. Therefore, the exit pupil EP corresponding to each of the RGB pixels for capturing an image has a large diameter and effectively captures light beams from an object, thereby improving the S/N of image signals.

Figures 3A, 3B:
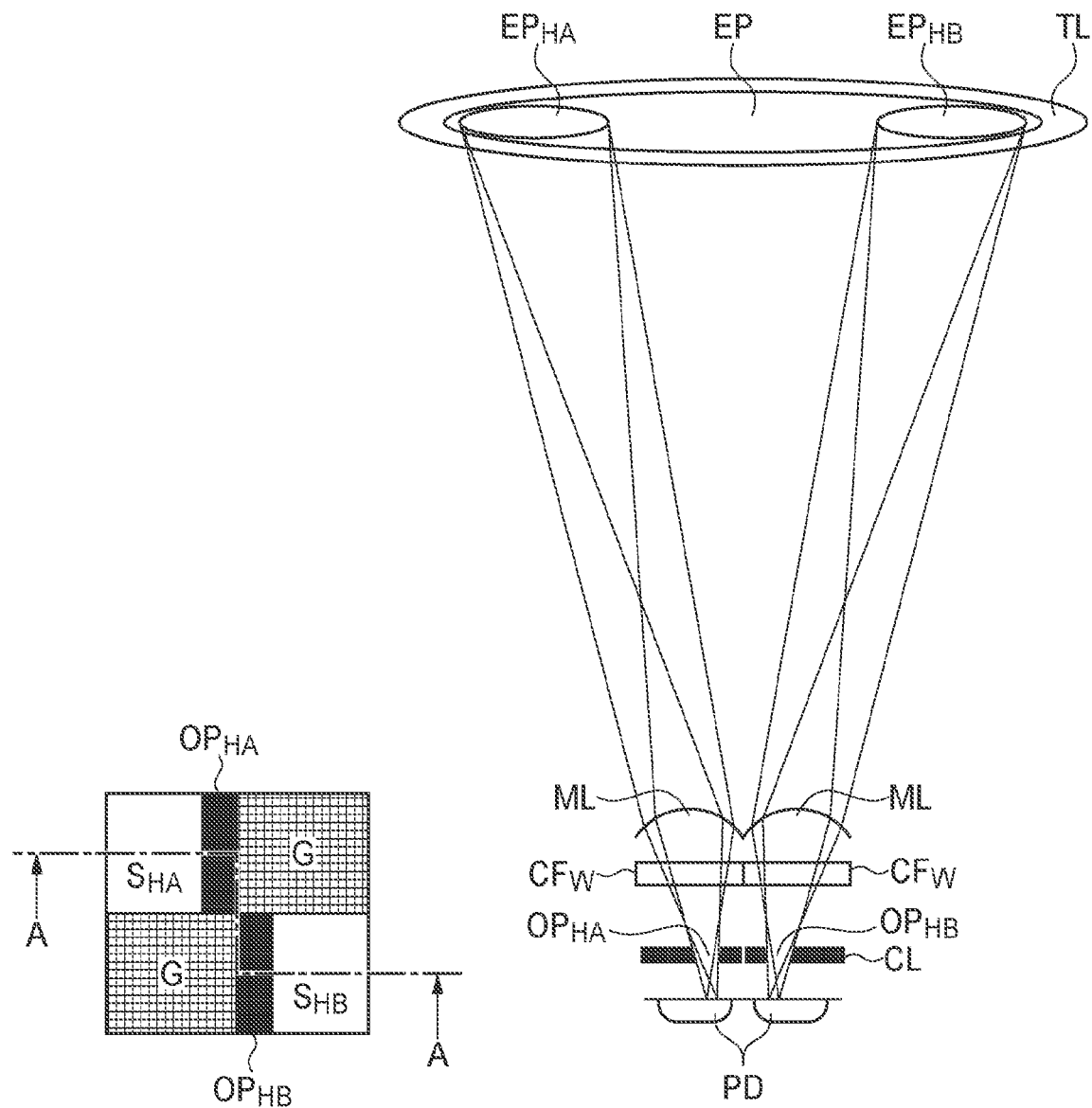
FIGS. 3A and 3B are diagrams showing an example of the arrangement and the structure of pixels for detecting a phase difference for performing pupil splitting in a horizontal direction (lateral direction) of a lens according to the first embodiment of the present invention.

FIGS. 3A and 3B show an example of the arrangement and the structure of pixels for detecting a phase difference (AF pixels) for performing pupil splitting in a horizontal direction (lateral direction) of the lens according to the present embodiment.

FIG. 3A is a plan view of pixels arranged in two rows and two columns including a pair of pixels for detecting a phase difference. In the case where an image capturing signal is to be obtained, the G pixels provide a main component of luminance information. Among human image recognition characteristics, humans are sensitive to luminance information, and therefore if a G pixel is missing, a deterioration in the image quality is likely to be perceived. On the other hand, pixels of colors other than green, specifically, R pixels or B pixels are pixels for acquiring color information, and among human image recognition characteristics, humans are insensitive to color information and thus are unlikely to notice a deterioration in the image quality even when a few pixel for obtaining color information are missing. For this reason, in the present embodiment, among pixels arranged in two rows and two columns, the G pixels are left as pixels for capturing an image, and a pair of pixels for detecting a phase difference, that is, SHA and SHB are disposed in the positions of the R pixel and the B pixel.

FIG. 3B is a diagram showing a cross-section taken along line A-A in FIG. 3A (i.e., a cross-section of the pair of pixels for detecting a phase difference) and light paths from the photographic optical system.

The micro lenses ML and the photoelectric conversion units PD have the same configuration as those of the pixels for capturing an image shown in FIG. 2B. In the present embodiment, since signals from the pixels for detecting a phase difference are not used as image signals, a colorless, transparent filter CFW is disposed instead of a color separation filter. Moreover, since pupil splitting is performed by a pair of pixels, openings of the wiring layer CL are shifted in one direction relative to center lines of the micro lenses ML. That is to say, openings of the first AF pixel SHA and the second AF pixel SHB that constitute the pair of pixels for detecting a phase difference are shifted in mutually different directions.

Specifically, an opening OPHA of the pixel for detecting a phase difference SHA is shifted rightward in the horizontal direction and therefore receives light beams passing through an exit pupil EPHA in a left-side portion of the lens TL. Similarly, an opening OPHB of the pixel for detecting a phase difference SHB is shifted leftward in the horizontal direction and therefore receives light beams passing through an exit pupil EPHB in a right-side portion of the lens TL. A luminance waveform acquired by a plurality of pixels for detecting a phase difference SHA that are regularly arranged in the horizontal direction is taken as an image waveform A (a first image waveform). A luminance waveform acquired by a plurality of pixels for detecting a phase difference SHB that are regularly arranged in the horizontal direction is taken as an image waveform B (a second image waveform). It is possible to detect a focus deviation amount (defocus amount) of an object image having a luminance distribution in the horizontal direction by detecting relative positions of these image waveforms A and B.

It should be noted that although it is possible to perform focus detection by using the pair of pixels for detecting a phase difference SHA and SHB with respect to an object, for example, a vertical line, having a luminance distribution in a direction in which those pixels are arranged, it is not possible to perform focus detection with respect to a horizontal line, which is an object having a luminance distribution only in a direction orthogonal to the direction in which the pixels are arranged. To address this issue, in the present embodiment, pixels for detecting a phase difference for performing pupil splitting in a vertical direction (longitudinal direction) of the lens are also provided so that focus detection can be performed even in the latter case.

Figure 4A:
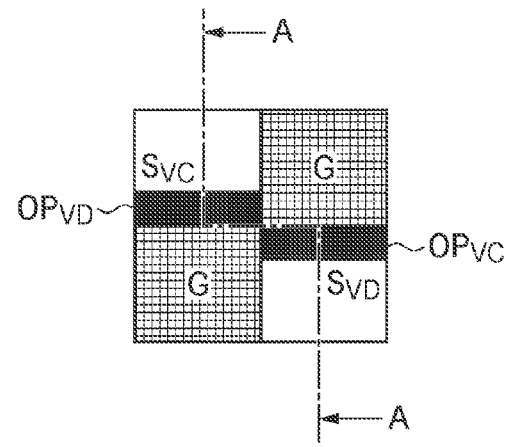
FIGS. 4A and 4B are diagrams showing an example of the arrangement and the structure of pixels for detecting a phase difference for performing pupil splitting in a vertical direction (longitudinal direction) of the lens according to the first embodiment of the present invention.
Figure 4B:
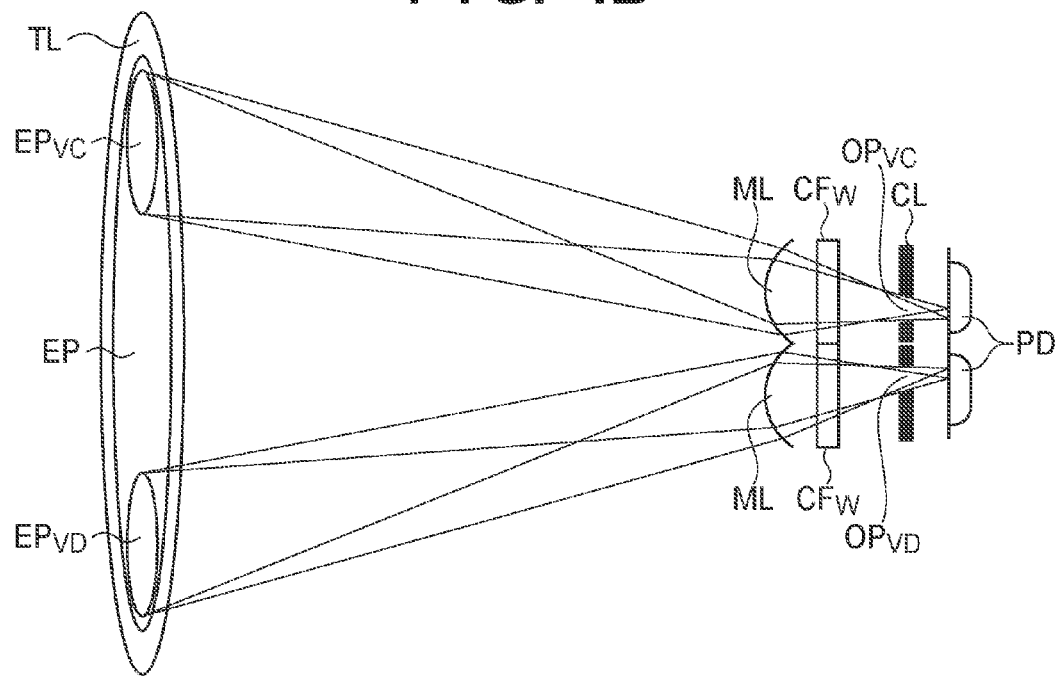

FIGS. 4A and 4B show an example of the arrangement and the structure of pixels for detecting a phase difference for performing pupil splitting in the vertical direction (longitudinal direction) of the lens according to the present embodiment.

FIG. 4A is a plan view of pixels arranged in two rows and two columns including pixels for detecting a phase difference, and as in FIG. 3A, the G pixels are left as pixels for capturing an image, and a pair of pixels for detecting a phase difference, that is, SVC and SVD are disposed in the positions of the R and B pixels.

FIG. 4B is a diagram showing a cross-section taken along line A-A in FIG. 4A (i.e., a cross-section of the pair of pixels for detecting a phase difference) and light paths from the photographic optical system.

As can be seen from a comparison with FIG. 3B, the pixels for detecting a phase difference have a like structure except that a pupil separation direction of the pixels shown in FIG. 4B is the longitudinal direction. That is to say, since an opening OPVC of the pixel for detecting a phase difference SVC is shifted downward in the vertical direction, this pixel receives light beams passing through an exit pupil EPVC in an upper-side portion of the lens TL. Similarly, since an opening OPVD of the pixel for detecting a phase difference SVD is shifted upward in the vertical direction, this pixel receives light beams passing through an exit pupil EPVD in a lower-side portion of the lens TL.

An object image acquired by a plurality of pixels for detecting a phase difference that are regularly arranged in the vertical direction is taken as an image waveform C. Moreover, an object image acquired by a plurality of pixels for detecting a phase difference SVD that are regularly arranged in the vertical direction is taken as an image waveform D. It is possible to detect a focus deviation amount (defocus amount) of an object image having a luminous distribution in the vertical direction by detecting relative positions of these image waveforms C and D.

Next, a contrast signal extracting procedure that is performed by the signal processing circuit 104 will be described.

FIG. 5 is a diagram showing a sequence of pixels in the vicinity of a pixel of interest a(m, k) of a video signal converted from signals from pixels for capturing an image by the signal processing circuit 104. The signal processing circuit 104 applies the following operations to the pixel of interest a(m, k) to calculate a horizontal-direction edge signal EdgeH, a vertical-direction edge signal EdgeV, and a two-dimensional edge signal Edge2D.

$$EdgeH=\{a(m,k)\times 2-a(m-n,k)-a(m+n,k)\}/2$$

$$EdgeV=\{a(m,k)\times 2-a(m,k-l)-a(m,k-l)\}/2$$

$$Edge2D=\{a(m,k)\times 4-a(m-n,k)-a(m+n,k)-a(m,k-l)-a(m,k-l)\}/4 \quad \text{(Formula 1)}$$

Here, (m, k) are coordinates of the pixel of interest, and "k" and "l" are correlation distances (the numbers of pixels) in the horizontal direction and the vertical direction, respectively. The values of "k" and "l" can be determined according to, for example, the resolution in a focal plane of the photographic optical system and are generally about 2 to 8.

The signal processing circuit 104 integrates absolute values of the respective edge signals obtained for each pixel contained in a predetermined focus detection region and obtains a contrast signal of the focus detection region. Moreover, the signal processing circuit 104 obtains a contrast evaluation value that represents the extent of closeness to the focusing position indicated by the contrast signal. The contrast evaluation value may also be determined from a relationship between the highest contrast level value and a currently achieved contrast level value using, for example, a previously prepared table. Alternatively, the contrast evaluation value may be obtained using a predefined formula. In the present embodiment, it is assumed that the higher the contrast evaluation value, the higher the achieved contrast level.

When performing focus detection that uses a contrast signal (contrast-detection type AF), the control circuit 105 drives the focus adjustment lens (not shown) included in the photographic lens 101 such that a contrast signal obtained in a predetermined focus detection region is maximized. Hereinafter, driving of the focus adjustment lens included in the photographic lens 101 will be referred to as focus driving of the photographic lens 101.

Figure 6:
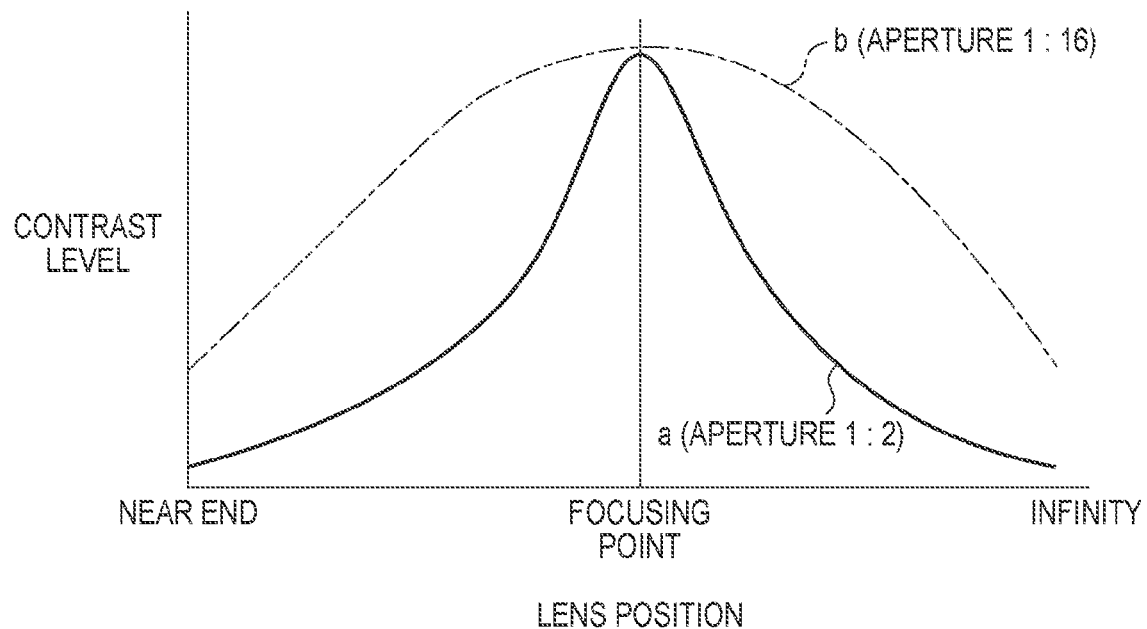
FIG. 6 is a diagram showing an example of changes in contrast level before and after a focusing position of the lens.

FIG. 6 is a diagram showing an example of how the contrast level obtained by the signal processing circuit 104 changes before and after the focusing position during focus driving of the photographic lens 101. Reference symbol "a" indicates changes in the case where the aperture 102 is 1:2, and reference symbol "b" indicates changes in the case of 1:16. As is apparent from FIG. 6, the contrast value increases as the photographic lens 101 approaches the focusing point due to focus driving, and decreases as the photographic lens moves away from the focusing point.

Moreover, in the case where the aperture 102 is open, the depth of focus is shallow as compared with the case where the aperture is closed, and therefore it can be found that a high contrast value region in the case where the aperture 102 indicated by "a" is 1:2 is narrower than that in the other case. For this reason, the control circuit 105 performs focus detection based on a contrast value with consideration given to an aperture value.

Since there is no restriction as to the positions of pixels serving as pixels for detecting a phase difference among the pixels provided in the image sensor 103, there is no restriction as to the position within a screen that can be subjected to focus detection. Moreover, focus detection by the above-described extraction of the contrast signal can also be performed using an image signal obtained from an arbitrary portion within the screen. Thus, focus detection can be applied to a specific region within the screen according to the conditions of the object or an instruction from a user, and the region within the screen to be subjected to focus detection is referred to as a focus detection region.

Figure 7:
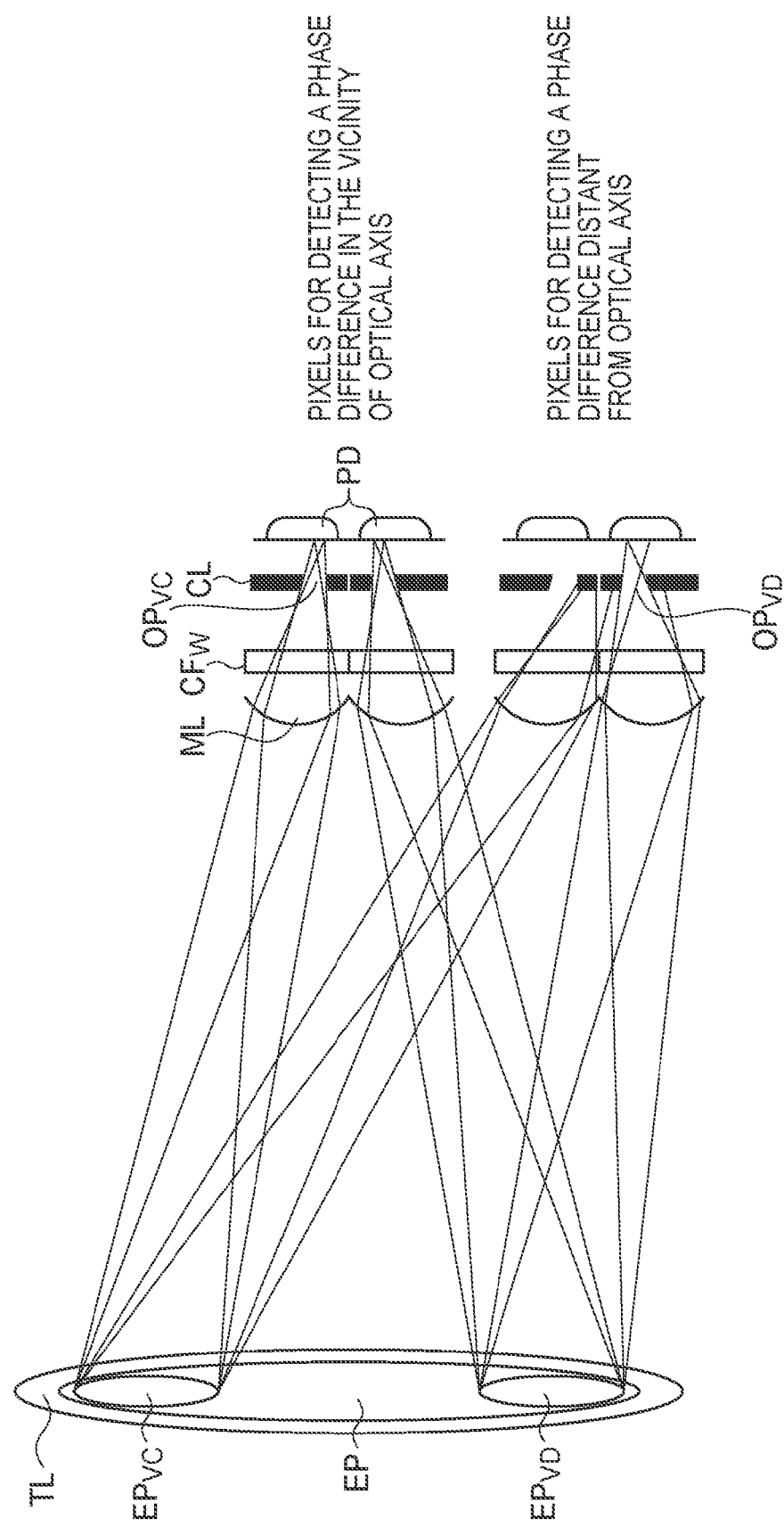
FIG. 7 is a diagram showing an example of a state of light beams that are incident on pixels for detecting a phase difference at positions of different image heights in the case where an aperture has a large opening diameter.

FIG. 7 is a diagram showing how light beams are incident on pixels for detecting a phase difference that are provided in a region close to the center of an optical axis of the photographic lens 101 (at a small image height) in the case where the opening diameter of the aperture 102 is large, and on pixels for detecting a phase difference that are provided in a region distant from the center of the optical axis (at a large image height). As shown in this diagram, in the case where the aperture 102 has a large opening diameter, there is a possibility that a light beam may not be properly incident on pixels for detecting a phase difference in a region distant from the center of the optical axis. If this is the case, it is not possible to perform appropriate phase difference detection from a signal from the pixels for detecting a phase difference in the region distant from the center of the optical axis.

Figure 8:
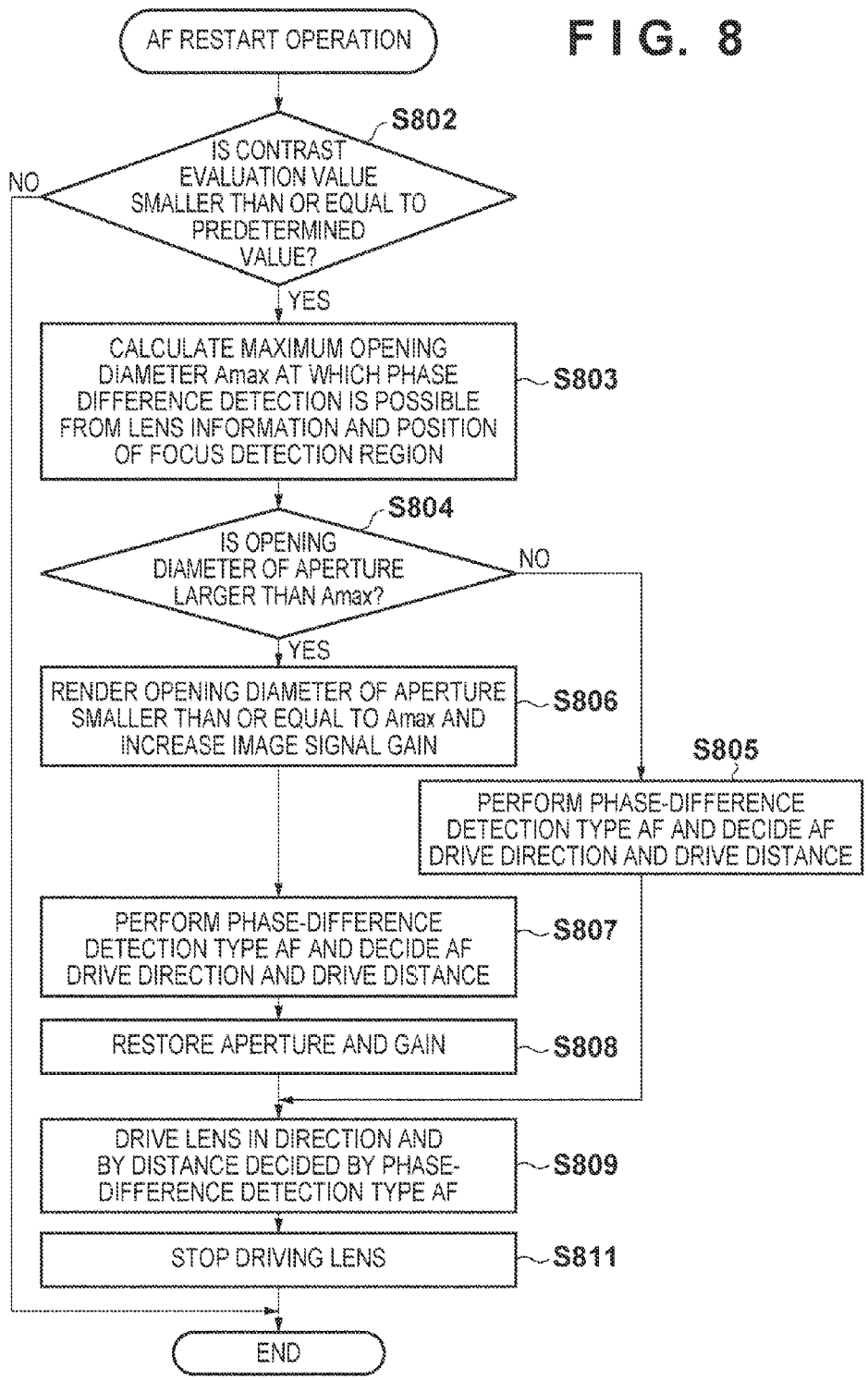
FIG. 8 is a flowchart for explaining an operation of the image capturing apparatus according to the first embodiment of the present invention in a state in which a focus adjustment lens is stopped at the focusing position.

FIG. 8 is a flowchart for explaining an automatic focus detection operation of the image capturing apparatus according to the present embodiment, in particular, an operation in a state in which the focus adjustment lens is stopped at the focusing position. This operation is realized by the control circuit 105 controlling the various units.

As described above, although the control circuit 105 stops focus driving of the photographic lens 101 once a predetermined focusing condition is met during recording of a moving image, there are cases where it is required to restart AF as a result of movement or the like of the object. For this reason, the control circuit 105 periodically determines whether it is necessary to restart AF while focus driving is stopped, and executes AF restart if it is determined necessary. The signal processing circuit 104 may continuously calculate the contrast signal and the contrast evaluation value even during recording of a moving image, or may calculate the contrast signal and the contrast evaluation value when executing AF restart.

If an AF restart routine is started (step S801), the control circuit 105 determines whether or not a contrast evaluation value that is obtained by the signal processing circuit 104 for a current focus detection region is smaller than or equal to a predetermined value (step S802). If the contrast evaluation value exceeds the predetermined value (step S802: NO), it is determined that there is no or only a negligible change in a relative distance to the object, so that the control circuit 105 judges that AF restart is unnecessary and ends the processing.

On the other hand, if the contrast evaluation value is smaller than or equal to the predetermined value (step S802: YES), the control circuit 105 judges that it is necessary to restart AF. The contrast evaluation value decreases in the case where, for example, there is a change in the relative distance to the object.

If the control circuit 105 judges that AF restart is necessary, this circuit calculates a maximum opening diameter Amax at which phase difference detection is possible, based on the status information (the lens model information, the aperture value) of the photographic lens 101 and the position of the currently set focus detection region (pixels for detecting a phase difference). The maximum opening diameter Amax varies depending on an exit pupil position that varies depending on the type of the photographic lens 101 mounted and the position of the focus detection region, an exit pupil diameter that varies depending on the opening diameter of the aperture 102, and the position of the currently set focus detection region on the image sensor 103 (step S803). This is because an image incident on the pixels for detecting a phase difference of the image sensor 103 is restricted by being distorted due to the characteristics of the photographic lens 101 at near full aperture.

There is no particular limitation to the method for calculating the maximum opening diameter Amax, and, for example, a table storing the value of the maximum opening diameter Amax for each combination of the aperture value and the position of the focus detection region may be prepared in advance for each lens model. Alternatively, a formula that uses a parameter obtained from the status information of the photographic lens 101 and a value indicating the position of the focus detection region as variables can be prepared in advance, and the maximum opening diameter Amax calculated whenever necessary. Moreover, the use of the table and the use of the formula may be switched according to the mounted lens.

Then, the control circuit 105 determines whether or not an opening diameter A0 of the current aperture 102 is larger than the calculated maximum opening diameter Amax (step S804). If the opening diameter A0 of the aperture 102 is smaller than or equal to the maximum opening diameter Amax (step S804: NO), the control circuit 105 performs phase-difference detection type AF based on outputs from the pixels for detecting a phase difference contained in the currently set focus detection region and decides the drive direction and the drive distance for the focus adjustment lens (step S805).

On the other hand, if the opening diameter A0 of the aperture 102 is larger than the maximum opening diameter Amax (step S804: YES), phase-difference detection type AF that uses the pixels for detecting a phase difference contained in the currently set focus detection region does not work properly. Thus, the control circuit 105 outputs an aperture control signal for controlling the aperture 102 so as to render the opening diameter of the aperture 102 equal to or smaller than the maximum opening diameter Amax to the photographic lens 101. Moreover, in order to compensate for a decrease in the quantity of light that reaches the image sensor 103 due to the reduction in the opening diameter of the aperture 102, the control circuit 105 instructs the signal processing circuit 104 to increase the amount of a gain to be applied to an image signal that has been read out (step S806). For example, in the case where the aperture 102 is closed one stop, the gain can be increased by an amount corresponding to 1 EV.

Then, the control circuit 105 performs phase-difference detection type AF in a state in which the opening diameter of the aperture 102 has been decreased to a diameter smaller than or equal to Amax, and decides the direction and the distance of focus driving (step S807). Next, the control circuit 105 returns the opening diameter of the aperture 102 to A0 and the gain of the signal processing circuit 104 to G0 (step S808).

Once the focus drive distance and the drive direction are decided by phase-difference detection type AF in step S805 or S807, the control circuit 105 drives the focus adjustment lens of the photographic lens 101 (step S809). Then, the control circuit 105 stops focus driving (step S811) and ends the AF restart processing.

In this manner, according to the present embodiment, at the time of AF restart, it is determined whether the current opening diameter of the aperture of the lens is an opening diameter at which phase-difference detection type AF that uses pixels for detecting a phase difference contained in the currently set focus detection region can be performed. Then, if the opening diameter is a diameter at which phase-difference detection type AF cannot be performed, the aperture is changed to an opening aperture at which phase-difference detection type AF can be performed, and phase-difference detection type AF is executed (or the aperture is changed to an opening aperture at which phase-difference detection type AF can be performed, during a period in which phase-difference detection type AF is performed). Thus, even in the case where it is required to restart AF after the lens is stopped at the focusing position, the lens can be promptly driven to a new focusing position with no need to drive the lens within a minute range. Therefore, even in the case where AF restart is performed during recording of a moving image on an image capturing apparatus in which a lens that does not support driving within a minute range, the influence of the focus detection operation on a recorded image can be significantly suppressed. In particular, a great effect can be achieved in the case of an image capturing apparatus to which various lenses can be mounted, such as a lens-interchangeable type camera.

It should be noted that in the present embodiment, whether phase-difference detection type AF that uses pixels for detecting a phase difference contained in a focus detection region, of pixels for detecting a phase difference provided in an image sensor, can be performed is determined based on the opening diameter of an aperture. However, instead of the opening diameter, determination can be performed using any value that indicates the size of the opening diameter, including of course the aperture value. For example, in the case of obtaining the maximum opening diameter Amax by using a table, it may be effective to use a value other than the actual opening diameter in order to reduce the volume of the table.

Second Embodiment

Next, a second embodiment of the present invention will be described. Since an image capturing apparatus according to the present embodiment can have the same configuration as that of the first embodiment, descriptions thereof will be omitted.

Figure 9:
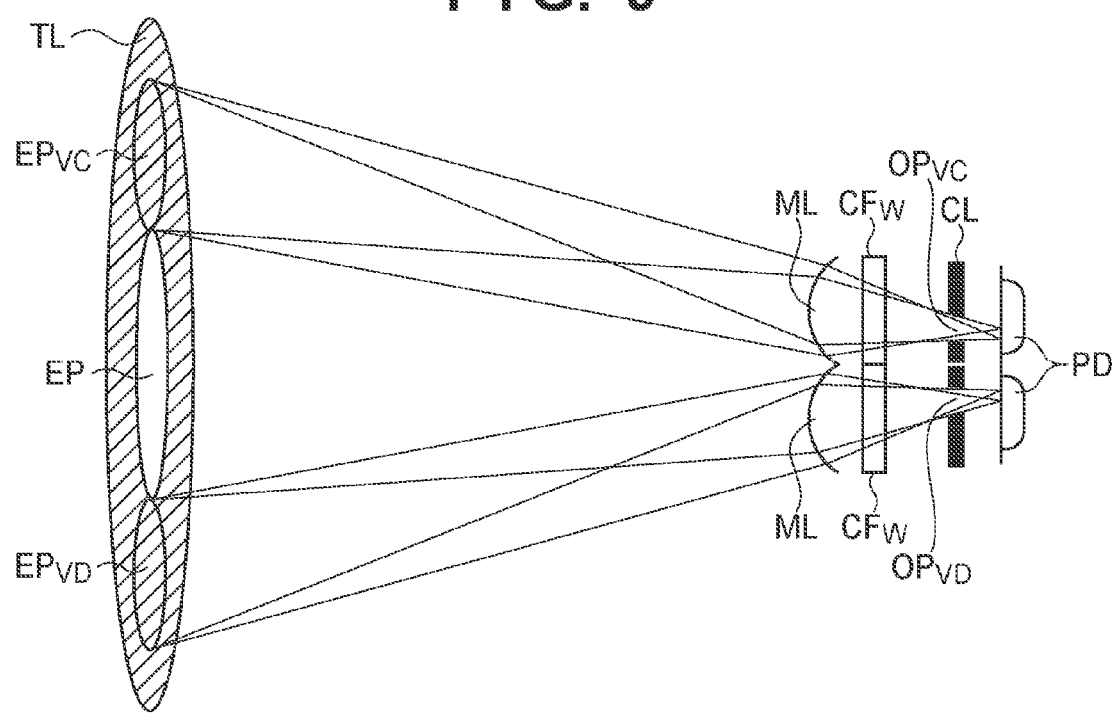
FIG. 9 is a diagram showing how light beams are incident on pixels for detecting a phase difference provided in a region near the center of an optical axis of the lens in the case where the aperture has a small opening diameter.

FIG. 9 is a diagram showing how light beams are incident on pixels for detecting a phase difference provided in a region close to the center of the optical axis of the photographic lens 101 in the case where the opening diameter of the aperture 102 is small. This diagram shows a state in which since the opening diameter of the aperture 102 is small, the diameter of the exit pupil EP is small, and light beams passing through the upper exit pupil EPVC and the lower exit pupil EPVD of the photographic optical system TL is blocked (eclipsed). It can be seen that in this state, light beams penetrating the exit pupils EPVC and EPVD do not reach the openings OPVC and OPVD of the pixels for detecting a phase difference.

The present embodiment relates to an AF restart operation under such conditions.

Figure 10:
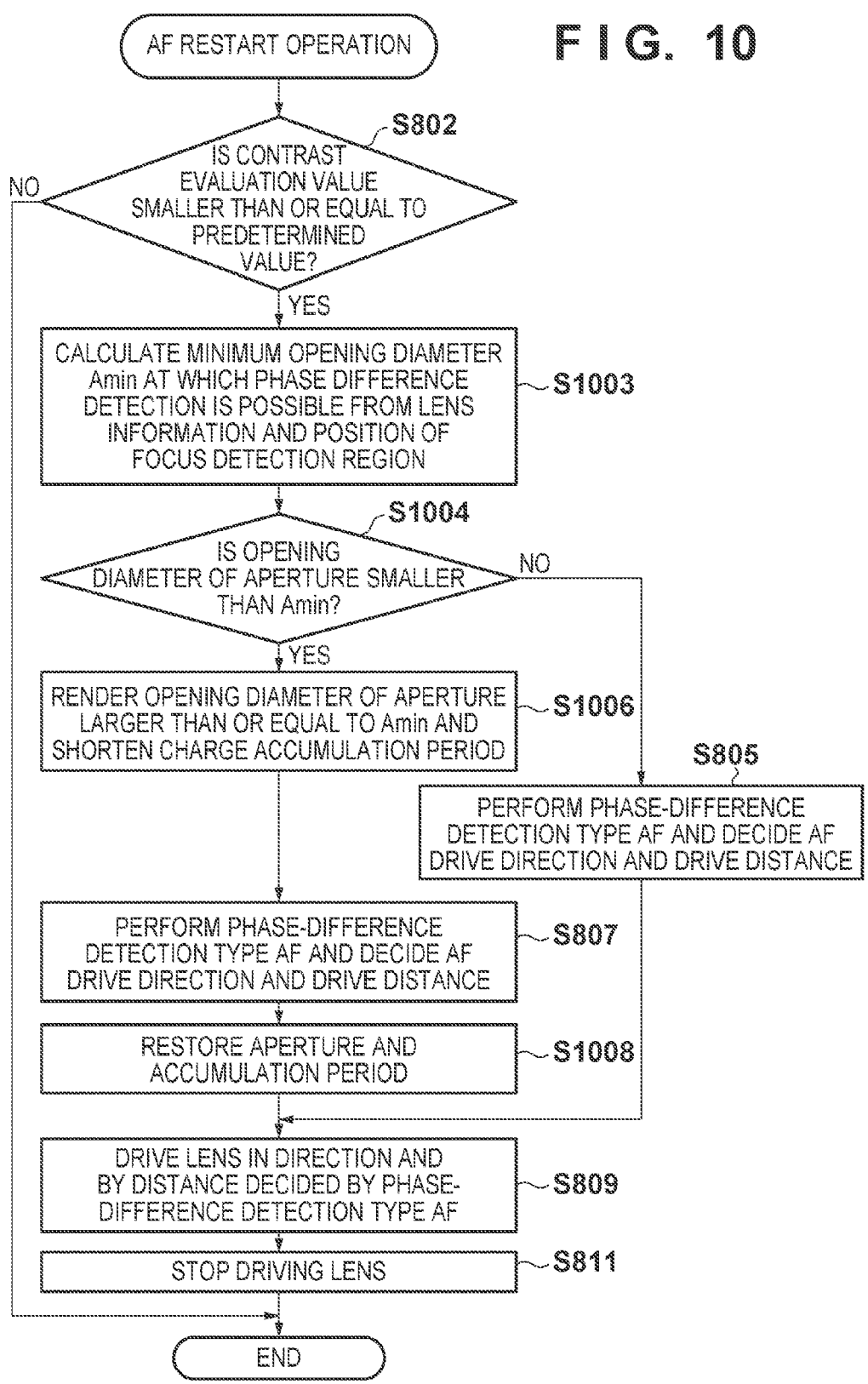
FIG. 10 is a flowchart for explaining an operation of an image capturing apparatus according to a second embodiment of the present invention in a state in which the focus adjustment lens is stopped at the focusing position.

FIG. 10 is a flowchart for explaining an automatic focus detection operation of the image capturing apparatus according to the present embodiment, in particular, an operation in a state in which the focus adjustment lens is stopped at the focusing position. In FIG. 10, like operations as those of the first embodiment are denoted by like reference numerals as those in FIG. 8, and descriptions thereof will be omitted.

If the contrast evaluation value is smaller than or equal to the predetermined value (S802: YES) and the control circuit 105 judges that it is necessary to restart AF, this circuit calculates a minimum opening diameter Amin at which phase difference detection can be performed (step S1003). As is the case with the maximum opening diameter Amax, the minimum opening diameter Amin also varies depending on the exit pupil position that varies depending on the type of the photographic lens 101 mounted and the position of the focus detection region, the exit pupil diameter that varies depending on the opening diameter of the aperture 102, and the position of the focus detection region on the image sensor 103.

As is the case with the maximum opening diameter Amax, there is no particular limitation to the method for calculating the minimum opening diameter Amin as well, and, for example, a table storing the value of the minimum opening diameter Amin for each combination of the aperture value and the position of the focus detection region may be prepared in advance for each lens model. Alternatively, a formula that uses a parameter obtained from the status information of the photographic lens 101 an a value indicating the position of the focus detection region as variables can be prepared in advance, and the minimum opening diameter Amin calculated whenever necessary. Moreover, the use of the table and the use of the formula may be switched according to the mounted lens.

Then, the control circuit 105 determines whether or not the opening diameter A0 of the current aperture 102 is smaller than the calculated minimum opening diameter Amin (step S1004). If the opening diameter A0 of the aperture 102 is larger than or equal to the minimum opening diameter Amin (step S1004: NO), the control circuit 105 performs phase-difference detection type AF based on pixels for detecting a phase difference contained in the currently set focus detection region, and decides the drive direction and the drive distance for the focus adjustment lens (step S805).

On the other hand, if the opening diameter A0 of the aperture 102 is smaller than the minimum opening diameter Amin (step S1004: YES), phase-difference detection type AF that uses the pixels for detecting a phase difference contained in the currently set focus detection region does not work properly. For this reason, the control circuit 105 outputs an aperture control signal for controlling the aperture 102 so as to render the opening diameter of the aperture 102 equal to or larger than the minimum opening diameter Amin to the photographic lens 101. Moreover, in order to offset an increase in the quantity of light that reaches the image sensor 103 due to the increase in the opening diameter of the aperture 102, the control circuit 105 sets an accumulation period (electronic shutter speed) of the image sensor 103 to T1 that is shorter than T0 before the start of the AF restart routine (step S1006). For example, in the case where the aperture 102 is opened one stop, the accumulation period can be set to ½.

Then, the control circuit 105 performs phase-difference detection type AF in a state in which the opening diameter of the aperture 102 has been increased to a size larger than or equal to the minimum opening diameter Amin, and decides the direction and the distance of focus driving (step S807). Next, the control circuit 105 returns the opening diameter of the aperture 102 to A0 and the accumulation period of the image sensor 103 to T0 (step S1008).

Once the focus drive distance and the drive direction have been decided by phase-difference detection type AF in step S805 or S807, the control circuit 105 drives the focus adjustment lens of the photographic lens 101 (step S809). Then, the control circuit 105 stops focus driving (step S811) and ends the AF restart processing.

According to the present embodiment, the same effects as those of the first embodiment can be achieved as well. It should be noted that also in the present embodiment, in the determination processing in step S1004, any value that indicates the size of the opening diameter, including of course the aperture value, can be used instead of the opening diameter as is the case with the first embodiment.

Other Embodiments

It goes without saying that the processes according to the above-described embodiments can be executed in combination. That is to say, when restarting AF, the control circuit 105 first compares the current opening diameter of the aperture with an opening diameter range in which phase-difference detection type AF that uses pixels for detecting a phase difference contained in the currently set focus detection region can be performed. Then, the first embodiment can be performed if the opening diameter of the aperture exceeds an upper threshold value of the above range, and the second embodiment performed if the opening diameter exceeds a lower threshold value of the range.

Moreover, in the above-described embodiments, if the opening diameter of the aperture is changed while phase-difference detection type AF is performed, the gain to be applied to an image signal in the signal processing circuit 104 is increased or the accumulation period of the image sensor 103 is shortened; however, these are not essential, because if the time required for phase-difference detection type AF is sufficiently short, the influence on a moving image during recording is negligible. For example, these measures may be taken in such a case where phase-difference detection type AF wavers.

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-262903, filed on Nov. 25, 2010, which is hereby incorporated by reference herein its entirety.

What is claimed is:

1. An image capturing apparatus comprising:
   an image sensor that has pixels for capturing an image and pixels for detecting a phase difference;
   wherein a phase difference is detected based on signals from the pixels for detecting a phase difference if an opening diameter of an aperture is within a specific range, the specific range being calculated based on (1) an exit pupil position of a photographic lens being mounted that varies depending on lens information, a type of the photographic lens, and a position of a focus detection region, (2) an exit pupil diameter that varies depending on the opening diameter of the aperture, and (3) the position of the focus detection region;
   a control unit that, only in a first case, changes the opening diameter of the aperture to be equal to or less than a maximum diameter of the specific range and performs detection of a phase difference, and only in a second case, changes the opening diameter of the aperture to be equal to or larger than a minimum diameter of the specific range and performs the detection of a phase difference,
   wherein the first case is where contrast information based on signals from the pixels for capturing an image meets a predetermined condition and the opening diameter of the aperture is larger than the maximum diameter, and the second case is where contrast information based on signals from the pixels for capturing an image meets a predetermined condition and the opening diameter of the aperture is less than the minimum diameter; and
   a drive unit that performs focus driving of the photographic lens in accordance with a focus drive distance and a drive direction decided based on a phase difference detected based on signals from the pixels for detecting a phase difference.

2. The image capturing apparatus according to claim 1, further comprising a decision unit that decides the focus drive distance and the drive direction for the photographic lens using the phase difference detected based on signals from the pixels for detecting a phase difference.

3. The image capturing apparatus according to claim 2, wherein the control unit changes the opening diameter of the aperture to be equal to or less than the maximum diameter while the decision unit is deciding the focus drive distance and the drive direction for the photographic lens.

4. The image capturing apparatus according to claim 3, wherein if the control unit changes the opening diameter of the aperture to be equal to or less than the maximum diameter while the decision unit is deciding the focus drive distance and the drive direction for the photographic lens, the control unit compensates for a decrease in a quantity of light due to the change of the opening diameter of the aperture by increasing a gain to be applied to an image signal read out from the image sensor.

5. The image capturing apparatus according to claim 1, wherein if the opening diameter of the aperture is less than the maximum diameter, the control unit changes the opening diameter of the aperture to the maximum diameter.

6. The image capturing apparatus according to claim 5, the control unit further changes, in the second case, the opening diameter of the aperture to be equal to or larger than the minimum diameter and performs the detection of a phase difference.

7. The image capturing apparatus according to claim 6, wherein if the control unit changes the opening diameter of the aperture to be equal to or larger than the minimum diameter by opening the aperture while the decision unit is deciding the focus drive distance and the drive direction for the photographic lens, the control unit offsets an increase in a quantity of light due to the change of the opening diameter of the aperture by shortening an accumulation period of the image sensor.

8. The image capturing apparatus according to claim 1, the control unit, if it is required to restart focus detection during recording of a moving image and while focus driving of the photographic lens is stopped, changes the opening diameter of the aperture to be equal to or less than the maximum diameter and performs the detection of a phase difference.

9. The image capturing apparatus according to claim 8, wherein if the contrast information based on the signals from the pixels for capturing an image is smaller than or equal to a predetermined value during recording of a moving image and while focus driving of the photographic lens is stopped, it is determined that a restart of the focus detection is required.

10. The image capturing apparatus according to claim 1, further comprising:
   a mounting unit for removable mounting of the photographic lens.

11. A control method for an image capturing apparatus including an image sensor that has pixels for capturing an image and pixels for detecting a phase difference, wherein a phase difference is detected based on signals from the pixels for detecting a phase difference if an opening diameter of an aperture is within a specific range, the specific range being calculated based on (1) an exit pupil position of a photographic lens being mounted that varies depending on lens information, a type of the photographic lens, and a position of a focus detection region, (2) an exit pupil diameter that varies depending on the opening diameter of the aperture, and (3) the position of the focus detection region, the method comprising:
   a control step of, only in a first case, changing the opening diameter of the aperture to be equal to or less than a maximum diameter of the specific range and performs detection of a phase difference, and only in a second case, changes the opening diameter of the aperture to be equal to or larger than a minimum diameter of the specific range and performs the detection of a phase difference, wherein the first case is where contrast information based on signals from the pixels for capturing an image meets a predetermined condition and the opening diameter of the aperture is larger than the maximum diameter, and the second case is where contrast information based on signals from the pixels for capturing an image meets a predetermined condition and the opening diameter of the aperture is less than the minimum diameter; and a drive step of performing focus driving of the photographic lens in accordance with a focus drive distance and a drive direction decided based on a phase difference detected based on signals from the pixels for detecting a phase difference.

* * * * *